(12) United States Patent
Sundar et al.

(10) Patent No.: US 11,495,738 B2
(45) Date of Patent: Nov. 8, 2022

(54) DUAL MAGNETIC TUNNEL JUNCTION DEVICES FOR MAGNETIC RANDOM ACCESS MEMORY (MRAM)

(71) Applicant: Taiwan Semiconductor Manufacturing Company, Ltd., Hsinchu (TW)

(72) Inventors: Vignesh Sundar, Sunnyvale, CA (US); Yu-Jen Wang, San Jose, CA (US); Luc Thomas, San Jose, CA (US); Guenole Jan, San Jose, CA (US)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 243 days.

(21) Appl. No.: 16/728,436

(22) Filed: Dec. 27, 2019

(65) Prior Publication Data

US 2020/0144488 A1    May 7, 2020

Related U.S. Application Data

(62) Division of application No. 16/056,791, filed on Aug. 7, 2018, now Pat. No. 10,522,746.

(51) Int. Cl.
*H01L 43/08* (2006.01)
*H01L 27/22* (2006.01)
(Continued)

(52) U.S. Cl.
CPC .......... *H01L 43/08* (2013.01); *G11C 11/161* (2013.01); *H01L 27/222* (2013.01); *H01L 43/02* (2013.01); *H01L 43/10* (2013.01); *H01L 43/12* (2013.01)

(58) Field of Classification Search
CPC ..... H01L 27/22; H01L 27/222; H01L 27/224; H01L 27/2409; H01L 27/2418;
(Continued)

(56) References Cited

U.S. PATENT DOCUMENTS 6,166,948 A    12/2000  Parkin et al.
6,539,608 B2    7/2003  Sharma et al.
(Continued)

FOREIGN PATENT DOCUMENTS

JP   WO2009101827 A1   6/2011
WO   2009101827 A1     8/2009

OTHER PUBLICATIONS

Jian-Gang Zhu et al "Microwave Assisted Magnetic Recording", IEEE Transactions on Magnetics, Jan. 2008, vol. 44 No. 1, pp. 125-131.
(Continued)

*Primary Examiner* — Cheung Lee
(74) *Attorney, Agent, or Firm* — Haynes and Boone, LLP

(57) ABSTRACT

A dual magnetic tunnel junction (DMTJ) is disclosed with a PL1/TB1/free layer/TB2/PL2 configuration wherein a first tunnel barrier (TB1) has a substantially lower resistance× area ($RA_1$) product than $RA_2$ for an overlying second tunnel barrier (TB2) to provide an acceptable magnetoresistive ratio (DRR). Moreover, first and second pinned layers, PL1 and PL2, respectively, have magnetizations that are aligned antiparallel to enable a lower critical switching current that when in a parallel alignment. The condition RA1<RA2 is achieved with one or more of a smaller thickness and a lower oxidation state for TB1 compared with TB2, with conductive (metal) pathways formed in a metal oxide or metal oxynitride matrix for TB1, or with a TB1 containing a dopant to create conducting states in the TB1 band gap.
(Continued)

Alternatively, TB1 may be replaced with a metallic spacer to improve conductivity between PL1 and the FL.

20 Claims, 7 Drawing Sheets

(51) Int. Cl.
*H01L 43/12* (2006.01)
*H01L 43/10* (2006.01)
*G11C 11/16* (2006.01)
*H01L 43/02* (2006.01)

(58) Field of Classification Search
CPC ... H01L 29/66; H01L 29/66984; H01L 29/82; H01L 29/861; H01L 29/88; H01L 43/02; H01L 43/04; H01L 43/06; H01L 43/065; H01L 43/08; H01L 43/10; H01L 43/12; H01L 43/14; H01L 45/04; H01L 45/12; H01L 45/1253; H01L 45/16; G11C 11/15; G11C 11/16; G11C 11/161

See application file for complete search history.

(56) References Cited

U.S. PATENT DOCUMENTS

| | | |
|---|---|---|
| 6,743,503 B1 | 6/2004 | Chen |
| 6,834,005 B1 | 12/2004 | Parkin |
| 6,847,510 B2 | 1/2005 | Childress et al. |
| 6,974,708 B2 | 12/2005 | Homg et al. |
| 6,977,801 B2 | 12/2005 | Carey et al. |
| 7,027,268 B1 | 4/2006 | Zhu et al. |
| 7,241,631 B2 | 7/2007 | Huai et al. |
| 7,335,961 B2 | 2/2008 | Guo et al. |
| 7,449,345 B2 | 11/2008 | Homg et al. |
| 7,596,015 B2 | 9/2009 | Kitagawa et al. |
| 7,742,263 B2 | 6/2010 | Fukumoto et al. |
| 7,978,442 B2 | 7/2011 | Zhang et al. |
| 8,159,866 B2 | 4/2012 | Apalkov et al. |
| 8,203,389 B1 | 6/2012 | Zhou et al. |
| 8,233,249 B2 | 7/2012 | Worledge |
| 8,269,292 B2 | 9/2012 | Homg et al. |
| 8,270,112 B2 | 9/2012 | Funayama et al. |
| 8,456,882 B2 | 6/2013 | Apalkov et al. |
| 8,462,461 B2 | 6/2013 | Braganca et al. |
| 8,582,240 B1 | 11/2013 | Chen et al. |
| 8,604,886 B2 | 12/2013 | Nikonov et al. |
| 8,634,163 B2 | 1/2014 | Tanabe et al. |
| 8,785,966 B2 | 7/2014 | Worledge et al. |
| 8,921,961 B2 | 12/2014 | Kula et al. |
| 8,981,505 B2 | 3/2015 | Moriyama et al. |
| 9,006,704 B2 | 4/2015 | Jan et al. |
| 9,230,571 B1 | 1/2016 | Chen et al. |
| 9,373,781 B2 | 6/2016 | Tang et al. |
| 9,553,258 B2 | 1/2017 | Whig |
| 9,614,258 B2 | 4/2017 | Takahashi et al. |
| 2010/0072524 A1 | 3/2010 | Huai et al. |
| 2012/0012953 A1 | 1/2012 | Lottis et al. |
| 2012/0023386 A1 | 1/2012 | Oh et al. |
| 2012/0058575 A1 | 3/2012 | Homg et al. |
| 2012/0155156 A1 | 6/2012 | Watts |
| 2012/0205758 A1 | 8/2012 | Jan et al. |
| 2012/0292723 A1 | 11/2012 | Luo et al. |
| 2013/0230741 A1 | 9/2013 | Wang et al. |
| 2014/0061828 A1* | 3/2014 | Lim .................. G11C 11/1659 257/421 |
| 2014/0217528 A1 | 8/2014 | Whig et al. |
| 2014/0291663 A1* | 10/2014 | Kuo .................. H01L 43/10 257/43 |
| 2016/0315249 A1 | 10/2016 | Kardasz et al. |
| 2017/0084836 A1 | 3/2017 | Kim et al. |
| 2017/0098762 A1 | 4/2017 | Worledge |

OTHER PUBLICATIONS

Hitoshi Kubota et al "Spin-Torque Oscillator Based on Magnetic Tunnel Junction with a perpendicularly Magnetized Free Layer and In Plane Magnetized Polarizer" Sep. 27, 2013, The Japan Society of Applied Physics, Applied Physics Express 6 (2013) 103003, pp. 1-3 27.

Zhongming Zeng et al "High-Power Coherent Microwave Emission from Magnetic Tunnel Junction Non-oscillators with Perpendicular Anisortropy" American Chemical Society, Jun. 4, 2012 vol. 6 No. 7 pp. 6115-6121.

M. Klaua et al. "Growth, Structure, Electronic, and Magnetic properties of MgO/Fe (001) bilayers and Fe/MgO/Fe (001) trilayers" Physical Review B vol. 64, 134411, 2001 The American Physical Society pp. 1-8 2001.

S. Ikeda et al. "A perpendicular-anisotropy CoFeB—MgO magnetic tunnel Junction" Nature Materials, Letters published online: Jul. 11, 2010.

PCT Search Report, International Application No. PCT/US12/24613 Applicant: MagIC Technologies Inc. dated Jun. 20, 2012, 12 pgs.

J.C Slonczweski "Current-driven excitation of magnetic multilayers" Journal of Magnetism and Magnetic Materials, vol. 159, Issues 1-2, Jun. 1996, pp. L1-L7, Elsevier.

PCT Search Report, International Application No. PCT/US2014/010309, Applicant: Headway Technologies Inc, dated May 13, 2014, 10 pages.

Yiming Huai et al. "Spin Transfer switching current reduction in magnetic tunnel junction base dual spin filter structures" Appl. Phys. Lett. 87, 222510 (2005); https://doi.org/10.1063/1.2138363, Published Online: Nov. 23, 2005, Accepted: Oct. 2005, pp. 1-3.

D.C. Worledge "Theory of Spin TorqueSwitching Current for the Double Magnetic Tunnel Junction," EEE Magnetics Letters, vol. 8, May 23, 2017, DOI: 10.1109/LMAG.2017.2707331, pp. 1-6.

Zhitao Diao et al. "Spin transfer switching in dual MgO magnetic tunnel junctions," Applied Physics Letters, vol. 90, Issue 13,10.1063/1.2717556,Published Online: Mar. 28, 2007, Accepted: Feb. 2007, pp. 1-3.

G. Hu et al. "STT MRAM with double magnetic tunnel junctions," IEEE International Electron Devices Meeting (IEDM), , Dec. 7-9, 2015, pp. 1-4.

\* cited by examiner

| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | -7 |
| Ru | $RuO_2$ | -253 |
| Cu | CuO | -254 |
| Co | CoO | -426 |
| Ni | NiO | -432 |
| Fe | FeO | -488 |
| Fe | $Fe_2O_3$ | -495 |
| Mo | $MoO_2$ | -502 |
| W | $WO_3$ | -509 |
| Sn | SnO | -514 |
| Zn | ZnO | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | BaO | -1056 |
| Hf | $HfO_2$ | -1084 |
| Mg | MgO | -1146 |
| Ca | CaO | -1208 |

*FIG. 15*

DUAL MAGNETIC TUNNEL JUNCTION DEVICES FOR MAGNETIC RANDOM ACCESS MEMORY (MRAM)

PRIORITY DATA

The present application is a divisional application and claims the benefit of U.S. patent application Ser. No. 16/056,791 filed Aug. 7, 2018, herein incorporated by reference in its entirety.

RELATED PATENT APPLICATIONS

This application is related to the following: Ser. No. 15/841,479, filing date 12/14/17; and Ser. No. 15/728,818, filing date 10/10/17, which are assigned to a common assignee and herein incorporated by reference in their entirety.

TECHNICAL FIELD

The present disclosure relates to a dual magnetic tunnel junction (DMTJ) comprised of a free layer that interfaces with a lower tunnel barrier (TB1) layer and an upper tunnel barrier (TB2) layer, and wherein the TB1 layer has a resistancexarea (RA) product substantially less than the TB2 layer, and spin polarizer layers adjoining the TB1 and TB2 layers are initialized antiparallel to each other to significantly reduce the critical current for switching the free layer.

BACKGROUND

Perpendicularly magnetized MTJs (p-MTJs) are a major emerging technology for use as embedded magnetic random access memory (MRAM) applications, and standalone MRAM applications. P-MTJ MRAM technology using spin-torque (STT-MRAM) for writing of memory bits was described by C. Slonczewski in "Current driven excitation of magnetic multilayers", J. Magn. Magn. Mater. V 159, L1-L7 (1996), and is highly competitive with existing semiconductor memory technologies such as SRAM, DRAM, and flash.

Reducing the critical switching current density for p-MTJs is a key challenge for integrating MRAM and STT-MRAM into existing complementary metal oxide semiconductor (CMOS) technologies. As the write current is reduced, smaller transistors may be used for each bit cell thereby potentially enabling higher density memory arrays and lower production cost. One of the strategies explored in the past for minimizing the critical current ($i_c$) for switching the free layer in a p-MTJ is a dual spin filter structure also referred to as a DMTJ. A typical DMTJ has a PL1/TB1/FL/TB2/PL2 configuration wherein PL1 and PL2 are first and second pinned layers, that adjoin first and second tunnel barrier layers TB1 and TB2, respectively, and create a spin torque effect on the free layer (FL) when a current is passed through the DMTJ in a perpendicular to plane direction. Preferably, each of PL1, PL2, and the FL has a magnetization aligned in a perpendicular to plane (vertical) direction. When PL1 and PL2 are initialized anti-parallel to each other, there is potentially a two-fold increase in the spin torque on the FL compared with a MTJ having a single spin polarizer in a PL/TB/FL configuration, for example. As a result, there is improved spin torque transfer efficiency and a reduction in ($i_c$).

In the aforementioned DMTJ, the PL1/TB1/FL stack may be considered as a first p-MTJ substructure while the FL/TB2/PL2 stack may be considered as a second p-MTJ substructure. In each p-MTJ substructure, the FL is free to rotate to a direction that is parallel (P state) or antiparallel (AP state) with respect to PL1 and PL2. It is important for the net magnetoresistive ratio (DRR) to be a large value, preferably higher than 1, as DRR is directly related to the read margin.

The magnetic performance for a DMTJ with two p-MTJ substructures is related not only to DRR and $i_c$, but also to the difference ($RA_2-RA_1$). In the prior art, one or two of these parameters are addressed with a new design, but there is a need to optimize all three simultaneously, and to reduce $i_c$ lower than that achieved with a single p-MTJ cell. Therefore, an improved DMTJ structure is needed where $i_c$ is minimized without a substantial sacrifice in DRR, and without increasing RA to an unacceptably high level that would lead to a decreased lifetime for one or both tunnel barrier layers.

SUMMARY

One objective of the present disclosure is to provide a DMTJ cell design that reduces the critical current ($i_c$) for switching the free layer to less than the $i_c$ necessary to toggle a single p-MTJ cell while enabling acceptable DRR and RA for advanced MRAM and STT-MRAM devices.

A second objective is to provide a method of initializing the pinned layers in a DMTJ that is compatible with the DMTJ cell design of the first objective.

According to a first embodiment of the present disclosure, a preferred DMTJ cell also known as a dual spin filter (DSF) comprises a free layer (FL) sandwiched between a lower first tunnel barrier layer (TB1) and an upper second tunnel barrier layer (TB2). There is also a first pinned layer (PL1) adjoining a bottom surface of TB1, and a second pinned layer (PL2) contacting a top surface of TB2. Thus, a first p-MTJ substructure of the DMTJ has a PL1/TB1/FL stack of layers while the second p-MTJ substructure has a FL/TB2/PL2 stack. All magnetic layers (PL1, PL2, FL) have a magnetization in a perpendicular to plane (vertical) direction that is orthogonal to a top surface of a substrate on which the DMTJ is formed. Moreover, the DMTJ is initialized in a so-called working state such that PL1 magnetization is antiparallel to that for PL2 to enable a lower is than when PL1 and PL2 magnetizations are parallel (non-working state), or compared with a single p-MTJ that switches back and forth between P and AP states. In the DMTJ working state, the first p-MTJ has a P state while the second p-MTJ has an AP state to give a P/AP configuration for the DMTJ, or the first p-MTJ has an AP state while the second p-MTJ has a P state to give an AP/P configuration.

Another key feature of the DMTJ working state is that the RA of TB1 hereafter referred to as $RA_1$ is substantially less than the RA of TB2 hereafter referred to as $RA_2$ so that the net DRR is maximized compared with a DMTJ where $RA_1=RA_2$ and where intrinsic magnetoresistance values for TB1 and TB2 are equivalent which results in a net DRR=0.

According to some embodiments, both of TB1 and TB2 are metal oxide layers. $RA_2$ is substantially larger than $RA_1$ because TB2 has one or both of a greater thickness than TB1, and a higher oxidation state. For example, TB2 may have a stoichiometric oxidation state where essentially all sites in the metal oxide lattice that are not occupied with metal atoms are filled with oxygen atoms, and TB1 may be substantially underoxidized with a plurality of sites in the metal oxide lattice that are not occupied by oxygen atoms.

In other embodiments, TB2 may be a metal oxide layer with a stoichiometric oxidation state while TB1 is a metal oxide matrix with conductive channels formed therein to lower resistivity and $RA_1$ in TB1. In alternative embodiments, the metal oxide matrix in TB1 may be replaced by a metal oxynitride matrix or metal nitride matrix having conductive channels therein. In yet another embodiment, TB1 is a metal oxide layer that is doped with one of N, S, Se, P, C, Te, As, Sb, or Si that creates conductivity states in the band gap of the TB1 layer.

The present disclosure also encompasses a method of forming a TB1 layer where $RA_1$ is substantially less than $RA_2$ of an overlying TB2 layer according to a DMTJ embodiment previously described. Methods are also provided for initializing a DMTJ such that PL1 magnetization is opposite to PL2 magnetization.

BRIEF DESCRIPTION OF THE DRAWINGS

FIG. 15 is a table listing the free energy of oxide formation for various elements.

DETAILED DESCRIPTION

The present disclosure is a DMTJ that is configured to enable a lower critical switching current density than realized in a single spin filter while providing acceptable DRR and ($RA_1+RA_2$) for the device, and features a free layer (FL) formed between a lower tunnel barrier layer (TB1) and an upper tunnel barrier (TB2) layer wherein TB1 has a lower RA product than that of TB2. Moreover, a first pinned layer (PL1) that contacts a bottom surface of TB1 has a vertical magnetization that is aligned anti-parallel to a vertical magnetization of a second pinned layer (PL2) contacting a top surface of TB2. The DMTJ may be incorporated in a MRAM, STT-MRAM, or in another spintronic device such as a spin torque oscillator (STO), sensor, or biosensor. The term "oxidation state" refers to the oxygen content in TB1 and TB2 layers comprised of a metal oxide or metal oxynitride. A top surface for a layer is defined as a surface facing away from the substrate while a bottom surface faces the substrate. An interface is a boundary region comprised of a bottom surface of one layer and an adjoining top surface of a second layer. A thickness of each DMTJ layer is in a z-axis direction while the planes of the layers are laid out in the x-axis and y-axis directions.

In related application Ser. No. 15/841,479, we disclosed various methods of minimizing RA in a metal oxide Hk enhancing layer in a p-MTJ including reducing outer portions of the metal oxide layer, or forming conductive pathways therein. Similarly, in related application Ser. No. 15/728,818, we disclosed a doped metal oxide Hk enhancing layer where the dopant is one of N, S, Se, P, C, Te, As, Sb, or Bi to fill vacant sites in a metal oxide lattice thereby lowering RA.

Here we disclose a DMTJ wherein the TB1 layer is designed with a structure that provides a $RA_1$ product that is lower than a $RA_2$ product in the TB2 layer in order to decrease the critical current density required to switch the FL magnetization while providing acceptable DRR. Accordingly, one or more of the schemes disclosed in related patent applications to increase conductivity in a Hk enhancing layer may also be applied to a tunnel barrier layer that has a metal oxide or metal oxynitride composition.

Figure 1A:
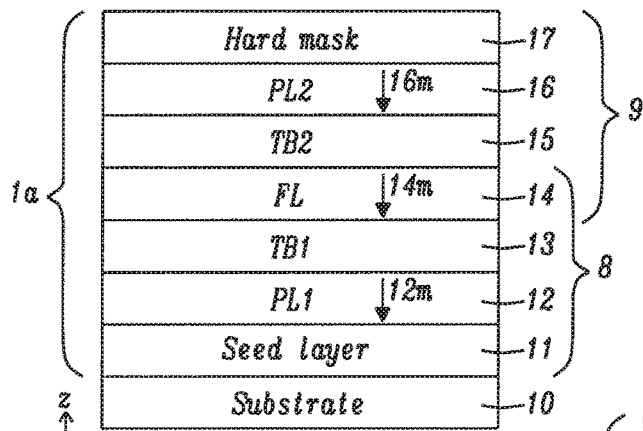
FIGS. 1A-1B are cross-sectional views of a DMTJ wherein the two pinned layers (PL1 and PL2) have magnetic moments aligned parallel and antiparallel to each other, respectively, and all magnetic layers including the free layer (FL) have perpendicular-to-plane magnetizations.

Referring to FIG. 1A, DMTJ 1a is shown in which an optional seed layer 11, PL1 12, TB1 13, FL 14, TB2 15, PL2 16, and hard mask or capping layer 17 are sequentially formed on a substrate 10. The DMTJ is depicted with a P/P magnetic state wherein a first p-MTJ substructure 8 has PL1 magnetization 12m aligned parallel to FL magnetization 14m (P state), and a second p-MTJ substructure 9 has PL2 magnetization 16m aligned parallel to the FL magnetization (P state).

Figure 2:
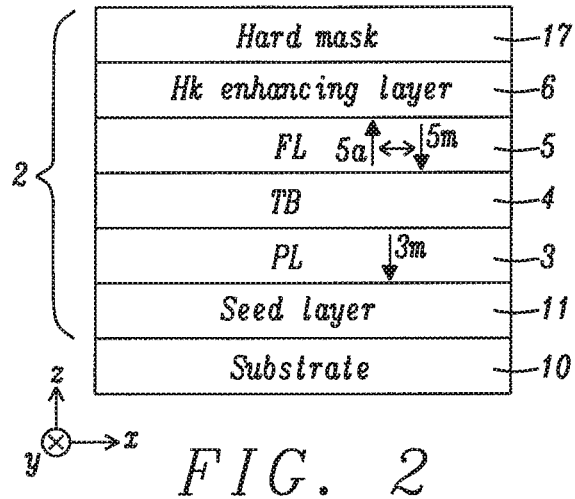
FIG. 2 is a cross-sectional view of a single p-MTJ in the prior art.
Figure 3A:
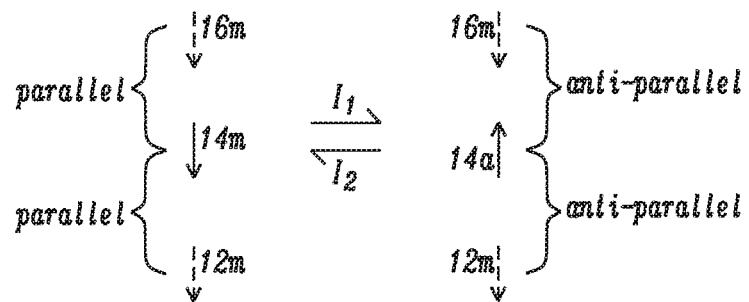
FIG. 3A depicts the DMTJ configuration in FIG. 1A where PL1 and PL2 magnetizations are parallel, and a current is applied to switch a P/P state to an AP/AP state, or a reverse current switches the AP/AP state to a P/P state.

FIG. 3A shows another representation of the two parallel (P) states in FIG. 1A. When a sufficiently large write (switching) current $l_1$ is applied, FL magnetization flips from 14m to 14a thereby establishing an AP/AP state for DMTJ 1a where FL magnetization 14a is anti-parallel to both PL1 magnetization 12m and PL2 magnetization 16m. It should be understood that since magnetizations 12m and 16m are in the same direction, the spin torque effect on the FL generated by current ($l_1$ or $l_2$) passing through PL1 effectively cancels the spin torque effect of PL2 on the FL magnetization. As a result, a higher switching current is required for DMTJ 1a compared with a single p-MTJ 2 shown in FIG. 2. The same outcome occurs when write current $l_2$ is applied to switch DMTJ 1a from an AP/AP state to a P/P state which means the magnetic orientations of PL1, PL2, and the FL in FIG. 3A are unfavorable in terms of the desired outcome of a reduced switching current compared with a single p-MTJ structure. Hereinafter, the magnetic orientations of the PL1, PL2, and FL layers in FIG. 3A are referred to as a non-working state with regards to the objective of designing a DMTJ having a lower $i_c$ than p-MTJ 2.

Figure 1B:
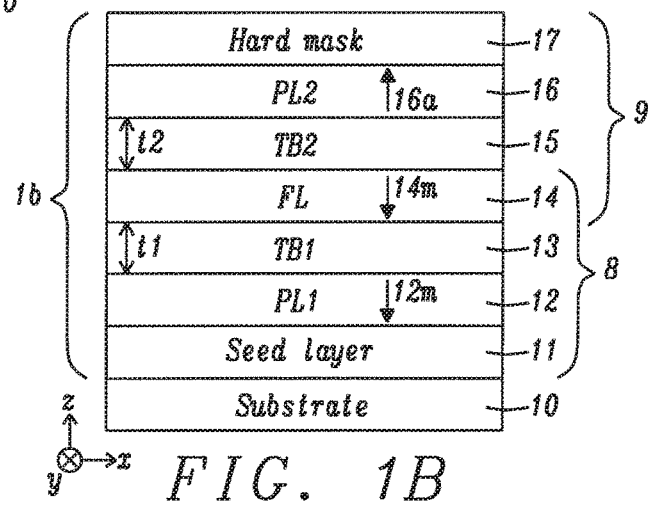

FIG. 1B illustrates an alternative configuration for the magnetizations in PL1, PL2, and the FL of DMTJ 1b. In particular, PL1 magnetization 12m is antiparallel to PL2 magnetization 16a while FL magnetization 14m is aligned parallel to 12m to give a P/AP state for the dual spin filter structure. Otherwise, all layers in the p-MTJ substructures 8, 9 are retained from FIG. 1A.

Figure 3B:
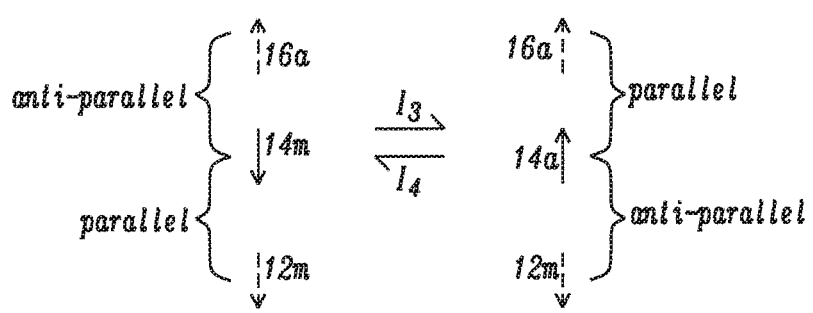
FIG. 3B depicts the DMTJ configuration in FIG. 1B where PL1 and PL2 magnetizations are antiparallel, and a current switches a P/AP state to an AP/P state, or a reverse current switches an AP/P state to a P/AP state.

In FIG. 3B, another representation of the P/AP state in FIG. 1B is depicted. Here, write current 13 is applied to switch FL magnetization 14m to 14a thereby establishing an AP/P state for DMTJ 1b where FL magnetization is now antiparallel to PL1 magnetization 12m but parallel to PL2 magnetization 16a in the absence of an external magnetic field. As a result, a lower switching current is required for the DMTJ compared with a single p-MTJ since the spin torque effect generated by current passing through PL1 is added to the spin torque effect on the FL magnetization from PL2 because magnetizations 12m, 16a are anti-parallel. Thus, the magnetic orientations of PL1, PL2, and the FL in FIG. 3B are favorable to reduce the critical switching current relative to a single p-MTJ, and compared with DMTJ 1a in FIG. 3A. DMTJ 1b in FIG. 1B is hereinafter referred to as a working state for the purpose of achieving the objectives of the present disclosure. Note that the same desirable outcome is realized by applying write current 14 to switch FL magnetization 14a to 14m in FIG. 3B and change the DMTJ from an AP/P state to a P/AP state.

Referring to FIG. 2, a single spin filter (p-MTJ 2) is depicted wherein seed layer 11, pinned layer 3, tunnel barrier 4, free layer 5, optional Hk enhancing layer 6, and hard mask 17 are sequentially formed on substrate 10. The Hk enhancing layer is typically a MgO layer that is advantageously used to form a second metal oxide interface with the FL thereby enhancing PMA and thermal stability. A critical current (not shown) is applied to switch the p-MTJ from a P state where FL magnetization 5m and PL magnetization 3m are parallel to an AP state where 5a and 3m are antiparallel, or from an AP state to a P state.

In FIG. 1A, where PL1 and PL2 are aligned parallel, DMTJ 1a may switch from a P/P state where FL magnetization is parallel to PL1 and PL2 magnetizations to an AP/AP state where FL magnetization is antiparallel to PL1 and PL2 magnetizations. Let us consider the DRR values in DMTJ 1a as $DRR_1=(R_{AP1}-R_{P1})/R_{P1}$ in p-MTJ substructure 8 and $DRR_2=(R_{AP2}-R_{P2})/R_{P2}$ in p-MTJ substructure 9. In the magnetic state of FIG. 1A, we see that the resistance of the stack in the AP/AP state is $R_{AP1}+R_{AP2}$, and in the P/P state is $R_{P1}+R_{P2}$, and so, net $DRR=(R_{AP1}+R_{AP2}-R_{P1}-R_{P2})/(R_{P1}+R_{P2})$, which can then be simplified to $(DRR_1*R_{P1}+DRR_2*R_{P2})/(R_{P1}+R_{P2})$. Considering a simple case where $R_{P1}=R_{P2}$, we see that net $DRR=DRR_1+DRR_2$.

In FIG. 1B, where FL magnetization is parallel to one of PL1 and PL2 and antiparallel to the other, toggling the FL switches DMTJ 1b back and forth between P/AP and AP/P states and the net DRR, using a similar approach as above is represented by the equation net $DRR=(R_{AP2}+R_{P1}-R_{P2}-R_{AP1})/(R_{P1}+R_{P2})=(DRR_2*R_{P2}-DRR_1*R_{P1})/(R_{P1}+R_{P2})$. Assuming, as in the previous case, that $R_{P1}=R_{P2}$, net DRR is then $(DRR_2-DRR_1)/2$.

We find that when toggling the free layer from magnetization 14m to 14a, or vice versa, the net DRR is 0 when TB1 and TB2 have the same RA, and equivalent intrinsic magnetoresistance. Therefore, the working state DMTJ configuration only has acceptable DRR when $RA_1$ is substantially different from $RA_2$, or if there is a considerable difference in intrinsic magnetoresistance for TB1 and TB2.

It should be understood that the benefit of a lower switching current density provided by DMTJ 1b compared with p-MTJ 2 is not dependent on the composition of the DMTJ layers 11-17. However, optimum performance is achieved when $RA_1$ of TB1 13 is less than $RA_2$ of TB2 15. As the difference $(RA_2-RA_1)$ increases, the net DRR for DMTJ also increases. According to one embodiment, the condition $RA_1<RA_2$ is realized by one or both of a smaller thickness for TB1 than TB2, and a lower oxidation state for TB1 compared with TB2. Because the roughness (non-uniformity) of a DMTJ layer generally increases with increasing distance from substrate 10, and a thin metal oxide layer is preferably grown (deposited) on a more uniform surface to prevent pinholes, TB1 is preferably deposited before FL 14 and TB2. The present disclosure also encompasses various TB1 compositions for reducing $RA_1$ that are described in later sections.

Seed layer 11 is formed on substrate 10 that may comprise a bottom electrode and a substructure (not shown) including a bit line (or source line), and a transistor that are electrically connected to the BE through vias. The seed layer serves to induce or enhance perpendicular magnetic anisotropy (PMA) in the overlying PL1 layer 12 and is preferably comprised of one or more of NiCr, Ta, Ru, Ti, TaN, Cu, Mg, or other materials typically employed to promote a smooth and uniform grain structure in overlying layers.

PL1 layer 12 may be a single ferromagnetic (FM) layer that is one or both of Co and Fe, or an alloy thereof with one or both of Ni and B, or may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. In other embodiments, an antiferromagnetic (AFM) pinning layer (not shown) may be provided between the optional seed layer and reference layer to pin the PL1 magnetization.

Figure 1C:
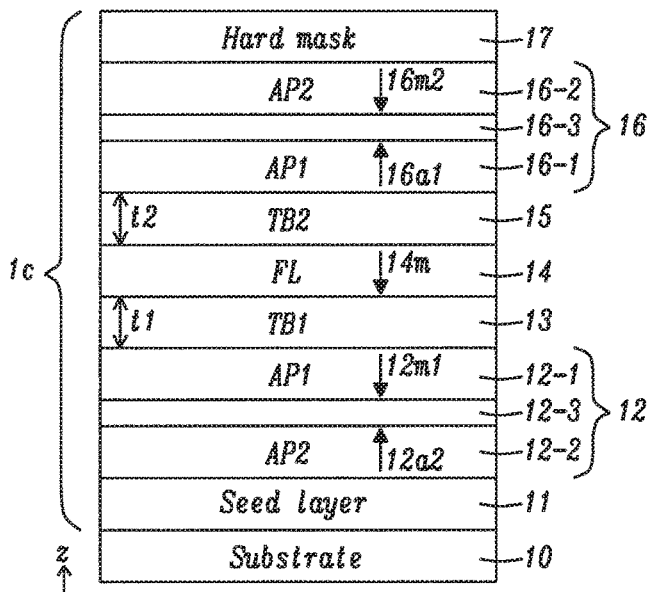
FIG. 1C is a cross-sectional view of a DMTJ wherein the two pinned layers have SyAP configurations, and the AP1 layer in PL1 is aligned antiparallel to the AP1 layer in PL2 according to an embodiment of the present disclosure.

In yet another embodiment depicted in FIG. 1C, DMTJ 1c is depicted and retains all of the DMTJ layers in FIG. 1B except PL1 12 may have a synthetic anti-parallel (SyAP) configuration represented by AP2/Ru/AP1 where an antiferromagnetic coupling (AFC) layer 12-3 made of Ru, Rh, or Ir, for example, is sandwiched between the AP2 FM layer 12-2 with magnetization 12a2 and the AP1 FM layer 12-1 having magnetization 12m1. The AP2 layer, which is also referred to as the outer pinned layer is formed on the seed layer while AP1 is the inner pinned layer and contacts TB1 13. The AP1 and AP2 layers may be comprised of CoFe, CoFeB, Co, or a combination thereof, or each may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and TB1. Antiparallel orientation of AP1 and AP2 layers becomes the lowest energy state when the AFC layer has an appropriate thickness, which is about 4 Angstroms when the AFC layer is Ru. Thus, the stability of the SyAP structure (orientations of 12m1 and 12a2) depends on the magnitude of the exchange interaction from AFC coupling, and on the anisotropy energy (perpendicular magnetic anisotropy or PMA) in the AP1 and AP2 layers.

According to the present disclosure, a key feature is that AP1 magnetization 12m1 is antiparallel to the magnetization in PL2 16. When PL2 has a SyAP configuration, magnetization 16a1 in AP1 layer 16-1 is preferably antiparallel to AP1 magnetization 12m1. Two different initialization methods are described in a later section. Magnetization 16m2 in AP2 layer 16-2 is antiparallel to magnetization 16a1 because of AF coupling through intermediate layer 16-3 that may be Ru, Rh, or Os, for example.

In either embodiment (FIG. 1B or FIG. 1C), each of TB1 13 and TB2 15 is preferably a metal oxide or metal oxynitride wherein the metal is selected from one or more of Mg, Ti, Al, Zn, Zr, Hf, and Ta. Moreover, one or both of TB1 and TB2 may be a lamination of one or more of the aforementioned metal oxides or metal oxynitrides. According to a preferred embodiment, TB2 has a stoichiometric oxidation state wherein essentially all metal atoms are completely oxidized with no vacant sites in the metal oxide lattice in order to enhance the $RA_2$ product. Meanwhile, TB1 has a non-stoichiometric oxidation state, and preferably has substantially higher conductivity than TB2 so that $RA_1$ is minimized compared with $RA_2$. As previously mentioned, the difference ($RA_2-RA_1$) is desirably increased when thickness t2 of TB2 is greater than thickness t1 of TB1.

TB1 13 and TB2 15 are preferably fabricated with a radio frequency (RF) physical vapor deposition (PVD) process that is typically employed to deposit insulator films. For example, a MgO target may be RF sputter deposited to yield one or both of TB1 and TB2. In some embodiments, a Mg layer (not shown) is deposited on PL1 12 with a RF PVD method. Then, the Mg layer may be oxidized with a natural oxidation (NOX) process where the Mg layer is exposed to a flow of oxygen for a certain period of time, or is oxidized with a conventional radical oxidation (ROX) process. Thereafter, an optional second Mg layer is deposited by a RF PVD method. During subsequent processes including one or more anneal steps, the second Mg layer becomes oxidized so that the MgO/Mg intermediate stack forms a MgO tunnel barrier layer. A similar sequence may be used to form TB2 on FL 14. The present disclosure anticipates that the metal (M) in a TB2 metal oxide layer may not be the same metal as in a TB1 metal oxide layer.

In other embodiments, all DMTJ layers 11-17 may be deposited with a PVD process in a sputter deposition chamber of a sputter deposition mainframe containing a plurality of deposition chambers and at least one oxidation chamber. Each PVD step is typically performed in an environment comprised of a noble gas such as Ar, and with a chamber pressure that is $5 \times 10^{-8}$ and $5 \times 10^{-9}$ torr. Note that a tunnel barrier layer such as TB2 15 may be formed by sputter depositing a metal oxide target to form a metal oxide layer having a stoichiometric oxidation state without requiring a separate oxidation step.

FL 14 may be Co, Fe, CoFe, or an alloy thereof with one or both of B and Ni, or a multilayer stack comprising a combination of the aforementioned compositions. In another embodiment, the free layer may have a non-magnetic moment diluting layer such as Ta or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack with inherent PMA described previously with respect to PL1 composition. The FL typically has a thickness between 10 and 30 Angstroms to enhance PMA therein.

Hard mask 17 is non-magnetic and generally comprised of one or more conductive metals or alloys including but not limited to Ta, Ru, TaN, Ti, TiN, and W. It should be understood that other hard mask materials including MnPt may be selected in order to provide high etch selectivity relative to underlying DMTJ layers during an etch process that forms DMTJ cells with sidewalls that stop on the substrate 10. Moreover, the hard mask may include an electrically conductive oxide such as RuOx, ReOx, IrOx, MnOx, MoOx, TiOx, or FeOx.

As indicated earlier, we have designed $RA_1$ for TB1 to be substantially less than $RA_2$ for TB2 in a preferred embodiment of the present disclosure. Accordingly, the net DRR for DMTJ 1b (or 1c) is substantially greater than for a DMTJ design where $RA_1=RA_2$. Moreover, TB1 is below TB2 in the DMTJ stack so that TB1 is a more uniform layer to offset a tendency for a thinner TB1 layer (where t1<t2) to form pinholes that could degrade performance, especially when TB1 has a non-stoichiometric oxidation state where vacant sites in the metal oxide matrix may allow impurities (oxygen or metals) to diffuse across a metal oxide/FL interface.

Figure 4:
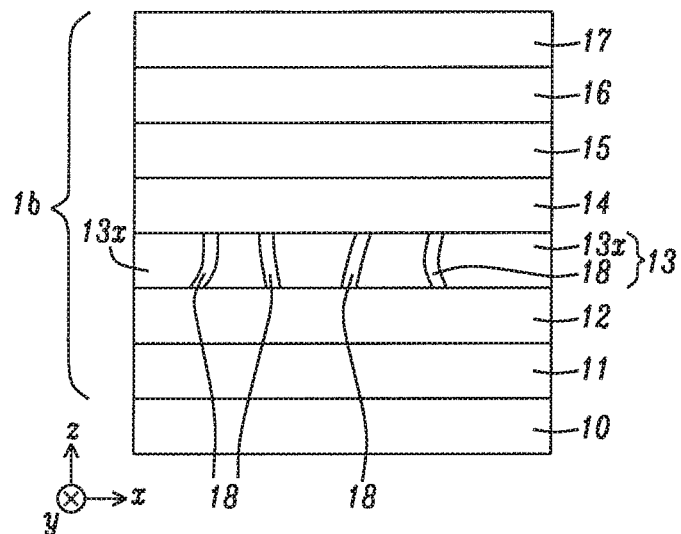
FIG. 4 is a cross-sectional view wherein the TB1 layer in FIG. 1B has a lower RA than the TB2 layer because of conductive channels formed within a TB1 insulator matrix according to an embodiment of the present disclosure.

According to one embodiment shown in FIG. 4, $RA_1$ in TB1 is engineered to be substantially lower than $RA_2$ in TB2 by forming conductive channels 18 in a metal oxide (MOx) or metal oxynitride (MON) matrix 13x. In other words, conductive channels formed in a MOx or MON matrix effectively represent an alternative form for TB1 compared with a substantially uniform MOx or MON layer described earlier. The metal M may be one or more of Mg, Ti, Al, Zn, Al, Zr, Hf, and Ta described previously with regard to TB1 composition. Conductive channels are comprised of a metal or alloy (M2) selected from one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, Os, and W. Conductive pathways may have a dimension (width) in the in-plane direction that varies from a single atom to a plurality of atoms. Preferably, each pathway extends from a top surface of PL1 12 to a bottom surface of FL 14. Furthermore, the pathways are not necessarily orthogonal to substrate 10, but may have an in-plane component in addition to a substantially vertical or perpendicular-to-plane direction.

Figure 5:
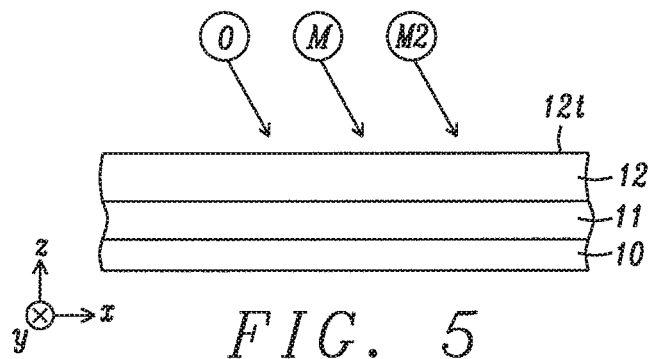
FIGS. 5-7 are cross-sectional views depicting various methods of forming conductive M2 channels in a metal oxide ($MO_x$) matrix according to embodiments of the present disclosure.

Referring to FIG. 5, a method similar to that described for forming a doped metal oxide layer in related patent application Ser. No. 15/728,818 may be employed to fabricate conductive channels in an insulator matrix. According to one embodiment, conductive pathways made of M2 metal or alloy are formed in a MOx matrix in a reactive gas environment generated by a chemical vapor deposition (CVD), physical vapor deposition (PVD), or a plasma enhanced CVD (PECVD) method wherein the metal M species, metal or alloy M2 species, and oxygen O species are simultaneously generated and directed at top surface 12t of PL1 12, and form a film thereon. The conductive pathways may be formed during the CVD, PVD, or PECVD process, or during a subsequent anneal step that promotes M2 diffusion and conglomeration within the MOx matrix. It should be understood that the reactive gas environment further includes nitrogen species when a MON matrix is desired. According to the present disclosure, the term species comprises one or more of a neutral atom or molecule, radicals, and positive or negative ions.

Figure 6:
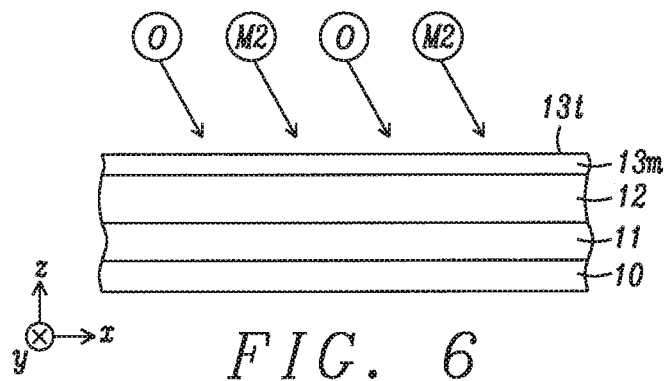

According to a second embodiment shown in FIG. 6, a metal M layer 13m with top surface 13t is deposited on PL1 layer 12 during a first step. Then, a second step is performed where the reactive gas environment mentioned in the previous embodiment is limited to oxygen O species and the M2 species thereby affording conductive M2 channels 18 in a $MO_x$ matrix 13x, or is limited to N, O, and M2 species to form M2 channels in a MON matrix in FIG. 4. Again, the conductive channels may be formed during a CVD, PVD, or PECVD process, or after a film that is a composite of M, M2 and 0 or a M/M20 film stack (not shown) is annealed to induce diffusion and conglomeration of the M2 atoms into distinct pathways 18. It should be understood that exposure of the metal M layer to 0 and M2 species may resputter all or an upper portion of the M layer to generate an intermediate film comprising M, M2, and O, or a bilayer stack with a M/MOM2 configuration, respectively. Thereafter, one or more anneal steps transform the intermediate film into conductive M2 channels within the MOx matrix (or MON matrix when N species and O species are combined in the reactive gas environment).

Figure 7:
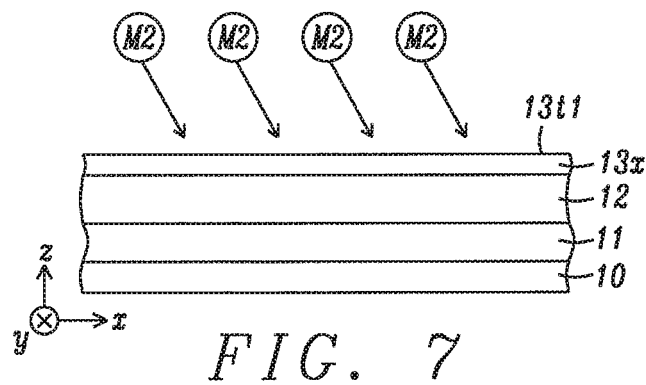

In FIG. 7, a third embodiment for conductive channel formation in an insulator matrix is provided. First, a $MO_x$ (or MON) layer 13x having top surface 13t1 is formed on PL1 12. Note that the metal oxide or metal oxynitride layer may be formed by a sequence involving deposition of one or more M layers followed by an oxidation step such as a natural oxidation (NOX) process where each of the one or more M layers is exposed to a flow of oxygen (or $O_2$ and $N_2$) in a reaction chamber to partially or completely oxidize all metal atoms in the M layer(s). Alternatively, a $MO_x$ layer (or MON layer) is deposited with a conventional RF PVD (sputter deposition) process. Thereafter, a reactive gas environment comprised of M2 species is employed to form conductive channels 18 in the $MO_x$ or MON layer. In some embodiments, a M2 layer may be formed on the intermediate $MO_x$ or MON layer, and then a subsequent anneal step is used to diffuse the M2 layer into the insulator layer followed by conglomeration into conductive M2 channels.

Figure 8:
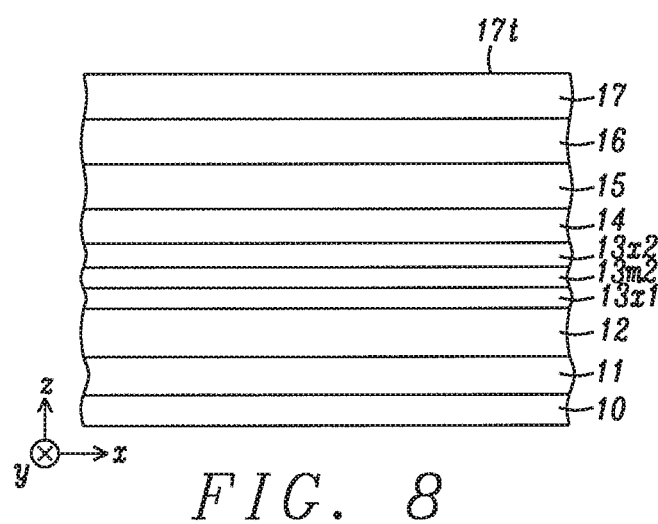
FIG. 8 is a cross-sectional view depicting an intermediate step in forming a DMTJ wherein a lower tunnel barrier layer has a substantially lower $RA_1$ product than $RA_2$ in an upper tunnel barrier layer.

Referring to FIG. 8, the present disclosure also anticipates a fourth method of forming conductive channels in a $MO_x$ or MON matrix. Seed layer 11 and PL1 12 are sequentially formed on substrate 10. Then a first $MO_x$ or MON layer 13x1, a M2 layer 13m2, and a second $MO_x$ or MON layer 13x2 are sequentially formed on the PL1 layer by a PVD or RF PVD process to provide an intermediate trilayer stack. Alternatively, either the first layer 13x1 or third layer 13x2 may be omitted to yield a bilayer intermediate stack. Thereafter, the remainder of the DMTJ stack including layers 14-17 is deposited on the uppermost layer in the intermediate bilayer or trilayer stack. The resulting intermediate DMTJ stack of layers in FIG. 8 is transformed into DMTJ 1b in FIG. 1B (or DMTJ 1c in FIG. 1C) by performing one or more anneal steps during fabrication of the memory device. For example, a first anneal step may occur before patterning the DMTJ stack into a plurality of DMTJ cells, and a second anneal step may be performed after patterning the DMTJ stack of layers. The one or more anneal steps transform the intermediate bilayer or trilayer stack into TB1 having conductive channels in an insulator matrix.

In all embodiments shown in FIGS. 5-8, a key feature is that the metal M has a higher affinity for oxygen than M2 such that M is selectively oxidized in the presence of M2. Accordingly, M2 is a metal in Table 1 in FIG. 15 preferably having a less negative free energy of oxide formation value than metal M, which is preferably Mg. More preferably, one or more of the metals in the top half of the table are selected for M2 when M is Mg.

Figure 9:
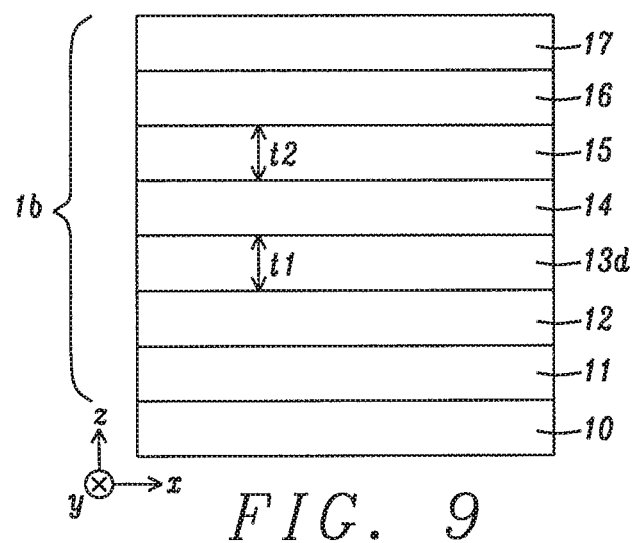
FIG. 9 is a cross-sectional view wherein the TB1 layer in FIG. 1B has a lower RA than the TB2 layer because the TB1 layer is doped to create conductivity states in the TB1 band gap according to an embodiment of the present disclosure.

Referring to FIG. 9, another embodiment of the present disclosure is depicted where TB1 in DMTJ 1b is a doped metal oxide layer 13d that is a MOD alloy wherein the dopant (D) content is from 100 ppm up to 20 atomic %. As we disclosed in related application Ser. No. 15/728,818, a dopant that is one of N, S, Se, P, C, Te, As, Sb, or Bi may be introduced in a metal oxide layer to fill vacant sites in a metal oxide lattice thereby lowering RA. Thus, the dopant will create conducting states in the band gap of a MgO tunnel barrier layer, for example, through hole generation while providing an additional advantage of blocking oxygen diffusion hopping through otherwise vacant sites in a TB1 layer with a non-stoichiometric oxidation state.

One of the methods that may be employed to form the doped metal oxide layer is represented by a process shown in one of FIGS. 5-7 wherein the metal M2 species is replaced by a dopant (D) species. In one embodiment represented in FIG. 7 where the M2 species is replaced by a dopant species, the dopant species is generated by an ion implantation method. Furthermore, a multistep sequence comprising an intermediate stack shown in FIG. 8 may be used where layer 13m2 is comprised of a dopant rather than a M2 metal or alloy. Thereafter, one or more anneal steps may be performed to diffuse the dopant layer into one or both of the metal oxide layers 13x1, 13x2. In some embodiments, layer 13m2 may be a MOD alloy. Preferably, the dopant (D) is one of N, S, Se, P, C, Te, As, Sb, and Bi.

Figure 10:
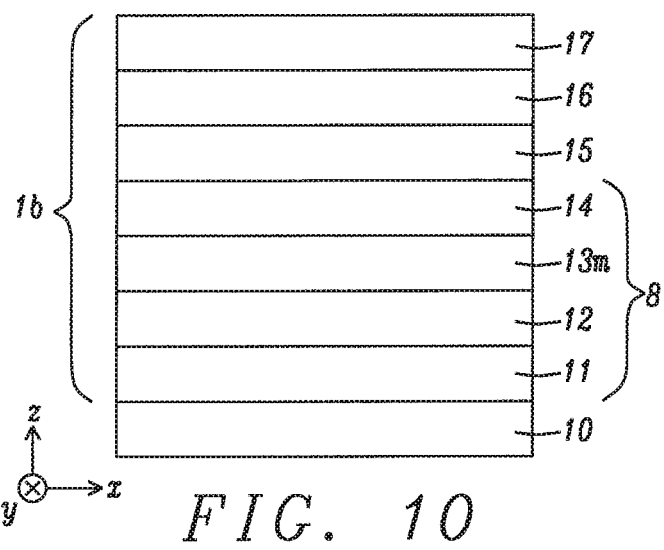
FIG. 10 is a cross-sectional view wherein the TB1 layer in FIG. 1B has a lower RA than the TB2 layer because the TB1 layer is comprised of a conductive metal layer according to an embodiment of the present disclosure.

Yet another embodiment of the present disclosure is illustrated in FIG. 10. Here TB1 is replaced with a metallic spacer layer 13m. Although PMA is lowered in FL 14 since there is no longer a second metal oxide/FL interface to generate additional interfacial perpendicular anisotropy, conductivity is substantially enhanced between PL1 and FL compared with a PL1/TB1/FL stack where TB1 is a metal oxide layer. Moreover, $DRR_1$ is considerably reduced which in turn increases the net DRR in DMTJ because RP for the P/AP state and RAP for the AP/P state for the lower p-MTJ substructure 8 in FIG. 1B or FIG. 1C are proximate to zero thereby substantially increasing the difference ($RA_2-RA_1$). However, the improvement in net DRR and larger difference ($RA_2-RA_1$) is offset with a larger critical switching current ($i_c$) since PL1 12 effectively produces no spin torque on FL 14 due to the lack of a tunneling effect of electrons between PL1 and the FL.

Figure 11:
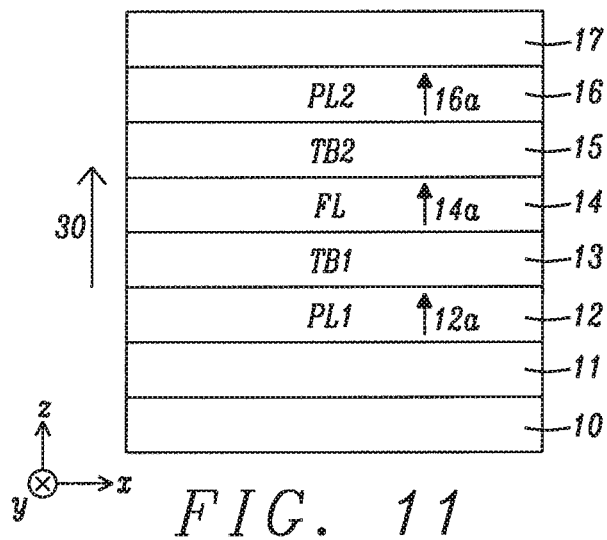
FIGS. 11-12 are cross-sectional views depicting an initialization sequence comprised of two applied fields to provide the DMTJ configuration in FIG. 1B.

The present disclosure also encompasses an initialization sequence for forming the magnetic layer orientations shown in FIG. 1B (or FIG. 1C) where there is an AP/P state for DMTJ 1b (or 1c) in which PL1 magnetization 12m (or 12m1) is antiparallel to PL2 magnetization 16a (or 16a1). Referring to FIG. 11, a first step in the initialization sequence is application of a magnetic field 30 in a vertical (z-axis) direction such that the applied field has sufficient magnitude to set pinned layer magnetizations 12a, 16a, as well as FL magnetization 14a in the same direction as the applied field. In the exemplary embodiment, the applied field 30 is in a (+) z-axis direction. However, in an alternative embodiment (not shown), the applied field may be in a (−) z-axis direction to provide magnetizations 12m, 16m, and 14m opposite to 12a, 16a, 14a, respectively.

Figure 12:
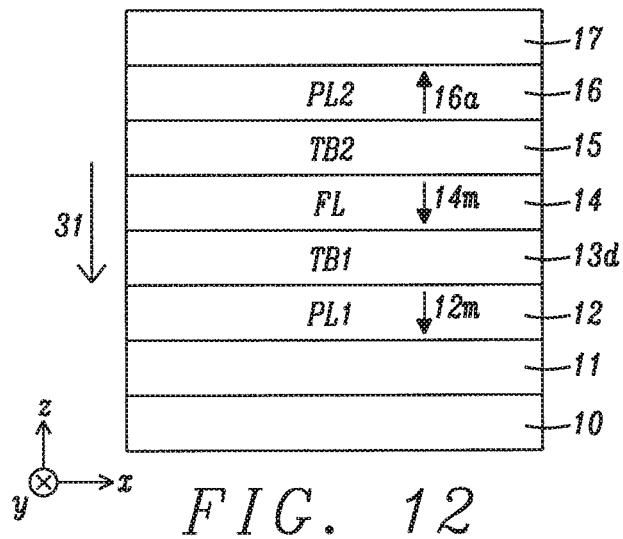

According to a second step in the initialization sequence shown in FIG. 12, a second applied field 31 is provided in a direction opposite to the direction of the first applied field, and has a magnitude sufficient to switch only FL magnetization 14a to 14m, and to flip PL1 magnetization 12a to 12m. As a result, PL1 magnetization is now antiparallel to PL2 magnetization 16a. It should be understood that PL2 16 coercivity must be larger than that of PL1 12 coercivity in order to maintain PL2 magnetization 16a during the second applied field.

Figure 13:
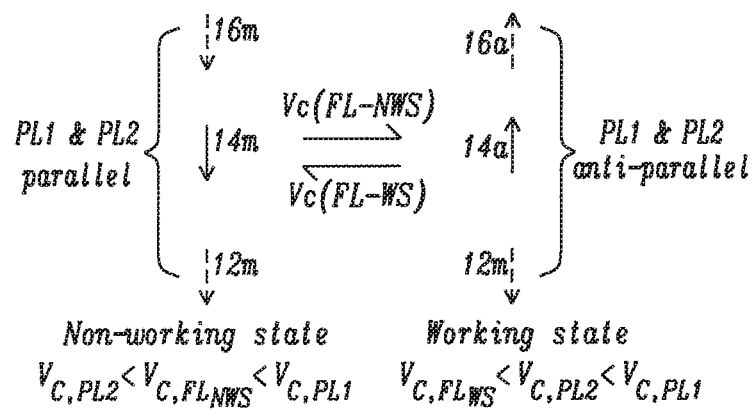
FIG. 13 is a scheme showing an initialization sequence involving an applied voltage to provide the DMTJ configuration in FIG. 1B.

According to a second initialization process shown in FIG. 13, magnetizations in PL1 12, PL2 16, and FL 14 may be set by application of an appropriate voltage. A large magnetic field (magnetic field 30) is first applied as with the previous method, sufficient to set the magnetizations of PL1, FL and PL2 all parallel to each other. As described previously in the disclosure, in this configuration (described in FIG. 1A), the spin torque on the FL from PL1 and PL2 cancel, and a relatively higher write current $V_{c,(FL-NWS)}$ is needed to switch the FL. This aspect of the nonworking state (NWS) is utilized for the initialization of the stack to the working state (WS). Either PL1 or PL2 is designed in such a way that the switching voltage to flip the magnetization $V_c$ $(_{PL1\ or\ PL2})$ is lower than the voltage needed to rotate the FL magnetization in the non-working state, i.e. $V_c$, $(_{FL-NWS})$>$V_c$ $(_{PL1\ or\ PL2})$>$V_c$ $(_{FL-WS})$. Once PL1 (or PL2) magnetization rotates, the device goes to the working state where a relatively lower write current $V_c$ $(_{FL-WS})$ also written as Vc, $FL_{ws}$ is required to switch FL magnetization 14a back to magnetization 14m. However, neither magnetization 12a nor PL2 magnetization 16a switches to magnetization 12m or magnetization 16m, respectively, when Vc, $FL_{ws}$ is applied. Thus, Vc, $FL_{ws}$ has the same effect as $l_4$ in FIG. 3B.

We have demonstrated the advantage of a DMTJ formed according to an embodiment of the present disclosure by fabricating patterned DMTJ cells with a critical dimension (CD) varying from 30 nm to 300 nm, and then testing high speed (10 ns pulse width) switching using a proprietary short loop test bed. A first set of DMTJ cells having a PL1/TB1/FL/TB2/PL2 configuration where PL1 and PL2 magnetizations were initialized to be parallel (non-working P/P state) was compared with a second set of DMTJ cells with the same configuration except PL1 and PL2 magnetizations were initialized to be antiparallel (working P/AP or AP/P state). In each case, write voltages were determined when toggling FL magnetization such that the non-working state switched back and forth between P/P and AP/AP states while the working state switched back and forth between AP/P and P/AP states.

Figure 14:
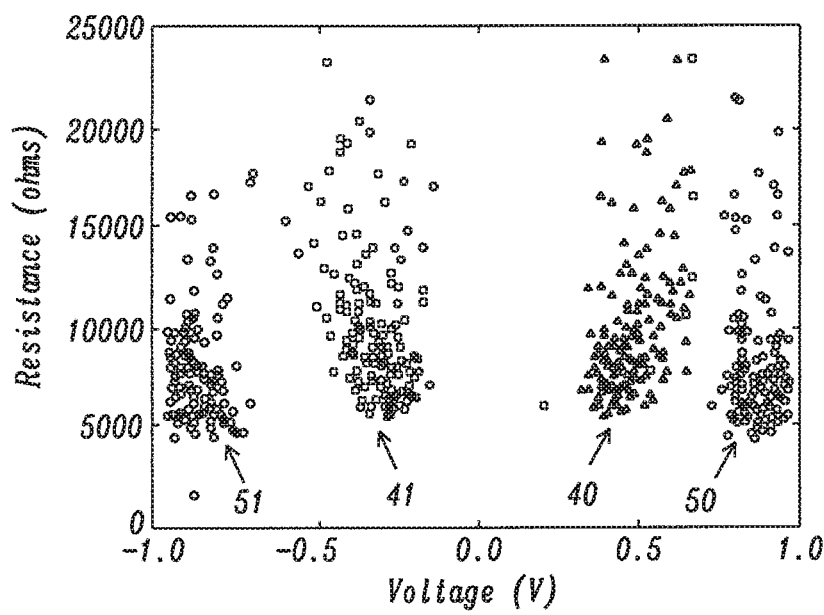
FIG. 14 is a plot of resistance as a function of voltage for the P/AP and AP/P states in FIG. 3B, and for the P/P and AP/AP states in FIG. 3A.

FIG. 14 illustrates the results of the aforementioned experiment. Resistance is plotted vs. voltage where the inner populations 40, 41, represent the $V_{c,0}$ and $V_{c,1}$, respectively, in a working state, and outer populations 50, 51, represent $Vc_{,0}$ and $Vc_{,1}$, respectively, in a non-working state. Note that $V_{c,0}$ for population 40 corresponds to switching a P/AP state to an AP/P state, and $Vc_{,0}$ for population 50 corresponds to switching a P/P state to an AP/AP state. We have found an increase in the write voltages to a more positive $Vc_{,0}$ (40 vs. 50) or to a more negative $Vc_{,1}$ (41 vs. 51) for the non-working state compared with the working state that confirms our original analysis predicting a lower ic for the DMTJ 1b in FIG. 1B (or DMTJ 1c in FIG. 1C) compared with the DMTJ 1a (non-working state) in FIG. 1A.

All of the embodiments described herein may be incorporated in a manufacturing scheme with standard tools and processes. DRR, RA, and is for a DMTJ are simultaneously optimized by formation of a TB1 in a first p-MTJ substructure that has a $RA_1$ substantially less than $RA_2$ of an overlying TB2 in a second p-MTJ substructure. Furthermore, PL1 magnetization in the first p-MTJ is aligned antiparallel to the PL2 magnetization in the second p-MTJ after an appropriate initialization sequence is performed in order to ensure a lower $i_c$ compared with a p-MTJ in a single spin filter, or compared with a DMTJ having PL1 and PL2 magnetizations aligned parallel to each other.

While the present disclosure has been particularly shown and described with reference to, the preferred embodiment thereof, it will be understood by those skilled in the art that various changes in form and details may be made without departing from the spirit and scope of this disclosure.

What is claimed is:

1. A method comprising:
   forming a first pinned layer on a substrate;
   forming a first tunnel barrier layer on the first pinned layer, wherein the first tunnel barrier layer has a first resistance×area product;
   forming a free layer on the first tunnel barrier layer;
   forming a second tunnel barrier layer on the free layer, wherein the second tunnel barrier layer has a second resistance×area product that is greater than the first resistance×area product;
   forming a second pinned layer on the second tunnel barrier layer; and
   performing an initialization process such that a magnetization of the first pinned layer is aligned antiparallel to a magnetization of the second pinned layer, and wherein a magnetization of the free layer and the respective magnetizations of the first pinned layer and the second pinned layer are aligned orthogonal to the substrate.

2. The method of claim 1, wherein the first tunnel barrier layer and the second tunnel barrier layer include a metal selected from the group consisting of Mg, Ti, Al, Zn, Zr, Hf, and Ta.

3. The method of claim 1, wherein the first tunnel barrier layer has a first thickness and the second tunnel barrier layer has a second thickness, wherein the first thickness is less than the second thickness.

4. The method of claim 1, wherein the first tunnel barrier layer has a first oxidation state and the second tunnel barrier layer has a second oxidation state, wherein the first oxidation state is lower than the second oxidation state.

5. The method of claim 1, wherein the first tunnel barrier layer is formed of a metal oxide material that includes a plurality of conductive channels extending therethrough.

6. The method of claim 5, wherein the plurality of conductive channels are include material selected from the group consisting of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, Os, and W.

7. The method of claim 1, wherein the first tunnel barrier layer is a doped metal oxide layer that includes a dopant selected from the group consisting of N, S, Se, P, C, Te, As, Sb, and Bi.

8. The method of claim 7, wherein the doped metal oxide layer is formed by a process that includes:
   forming a metal oxide layer on the first pinned layer; and
   exposing the metal oxide layer to a reactive environment comprised of a dopant species.

9. The method of claim 7, wherein the doped metal oxide layer is formed by a process that includes:
   forming a metal oxide layer on the first pinned layer; and
   implanting a dopant species into the metal oxide layer.

10. The method of claim 1, wherein the first tunnel barrier layer is formed by a process comprising:
    forming a metal oxide layer on the first pinned layer;
    exposing the metal oxide layer to a reactive environment comprised of a second metal species; and
    performing one or more anneal steps such that a plurality of conductive channels formed of the second metal species extend through the metal oxide layer.

11. The method of claim 1 wherein the initialization process includes:
    applying a first magnetic field such that the magnetizations of the first pinned layer, second pinned layer and the free layer are all aligned parallel to each other in a first direction and orthogonal to the substrate; and applying a second magnetic field such that the magnetization of the free layer and the magnetization of one of the first pinned layer and the second pinned layer switches to a second direction while the magnetization of the other one of the first pinned layer and the second pinned layer remains oriented in the first direction, the second direction being opposite the first direction.

12. The method of claim 1 wherein the initialization process includes:
applying a first magnetic field such that the magnetizations of the first pinned layer, the second pinned layer and the free layer are all aligned parallel to each other in a first direction and orthogonal to the substrate; and
applying a voltage that switches the magnetization of the free layer and the magnetization of one of the first pinned layer and the second pinned layer to a second direction that is opposite to the first direction while the magnetization of the other one of the first pinned layer and the second pinned layer remains oriented in the first direction.

13. A method comprising:
forming a first tunnel barrier layer on a substrate, wherein the first tunnel barrier layer has a first resistance×area product;
forming a free layer on the first tunnel barrier layer; and
forming a second tunnel barrier layer on the free layer, wherein the second tunnel barrier layer has a second resistance×area product that is greater than the first resistance×area product.

14. The method of claim 13, further comprising:
forming a first pinned layer on the substrate; and
forming a second pinned layer on the second tunnel barrier layer.

15. The method of claim 13, further comprising performing an initialization process such that a magnetization of the first pinned layer is aligned antiparallel to a magnetization of the second pinned layer, and wherein a magnetization of the free layer and the respective magnetizations of the first pinned layer and the second pinned layer are aligned orthogonal to the substrate.

16. The method of claim 13, wherein the first tunnel barrier layer has a first thickness and the second tunnel barrier layer has a second thickness, wherein the first thickness is less than the second thickness, and
wherein the first tunnel barrier layer has a first oxidation state and the second tunnel barrier layer has a second oxidation state, wherein the first oxidation state is lower than the second oxidation state.

17. A method comprising:
forming a first pinned layer on a substrate;
forming a first tunnel barrier layer on the first pinned layer, wherein the first tunnel barrier layer has a first resistance×area product;
forming a free layer on the first tunnel barrier layer, wherein the free layer interfaces with the first tunnel barrier layer;
forming a second tunnel barrier layer on the free layer, wherein the second tunnel barrier layer has a second resistance×area product that is different than the first resistance×area product, wherein the second tunnel barrier layer interfaces with the free layer;
forming a second pinned layer on the second tunnel barrier layer; and
performing an initialization process such that a magnetization of the first pinned layer is aligned antiparallel to a magnetization of the second pinned layer, wherein the performing of the initialization process such that the magnetization of the first pinned layer is aligned antiparallel to the magnetization of the second pinned layer includes:
performing a first initialization process such that the magnetization of the first pinned layer is aligned parallel to the magnetization of the second pinned layer; and
after performing the first initialization process, performing a second initialization process such that the magnetization of the first pinned layer is aligned antiparallel to the magnetization of the second pinned layer.

18. The method of claim 17, wherein one the first and second initialization processes includes applying a magnetic field and the other of the first and second initialization processes includes applying a voltage.

19. The method of claim 17, wherein a magnetization of the free layer and the respective magnetizations of the first pinned layer and the second pinned layer are aligned orthogonal to the substrate after the performing of the initialization process.

20. The method of claim 17, wherein the second resistance×area product is greater than the first resistance×area product.

* * * * *